(12) United States Patent
Van Der Mast

(10) Patent No.: US 6,930,755 B2
(45) Date of Patent: Aug. 16, 2005

(54) LITHOGRAPHIC APPARATUS AND DEVICE MANUFACTURING METHOD

(75) Inventor: Karel Diederick Van Der Mast, Helmond (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 10/305,390

(22) Filed: Nov. 27, 2002

(65) Prior Publication Data

US 2003/0179352 A1 Sep. 25, 2003

(30) Foreign Application Priority Data

Nov. 30, 2001 (EP) ............................................. 01204598

(51) Int. Cl.$^7$ .......................... G03B 27/42; G03B 27/54
(52) U.S. Cl. .......................................... 355/53; 355/67
(58) Field of Search .............................. 355/53, 67–71; 430/5, 20, 30, 311; 359/224, 855; 356/363, 400

(56) References Cited

U.S. PATENT DOCUMENTS

| | | | | |
|---|---|---|---|---|
| 5,298,365 A | * | 3/1994 | Okamoto et al. ........... 430/311 |
| 5,418,599 A | * | 5/1995 | Kamon .......................... 355/77 |
| 5,815,221 A | | 9/1998 | Kojima et al. | |
| 5,844,588 A | | 12/1998 | Anderson | |
| 5,936,713 A | * | 8/1999 | Paufler et al. ................. 355/67 |
| 6,134,008 A | * | 10/2000 | Nakao .......................... 356/508 |
| 6,515,734 B1 | * | 2/2003 | Yamada et al. ............... 355/54 |
| 6,593,064 B1 | * | 7/2003 | Gelbart ........................ 430/311 |

FOREIGN PATENT DOCUMENTS

| | | |
|---|---|---|
| EP | 0 620 676 A1 | 10/1994 |
| EP | 0 632 330 A2 | 1/1995 |
| EP | 0 632 330 A3 | 9/1996 |
| EP | 0 750 418 A2 | 12/1996 |
| EP | 0 875 386 A1 | 11/1998 |
| EP | 0 905 674 A1 | 3/1999 |
| JP | 60-107835 | 6/1985 |
| JP | 3-183115 | 8/1991 |
| JP | 2001-135562 | 5/2001 |

* cited by examiner

*Primary Examiner*—Henry Hung Nguyen
(74) *Attorney, Agent, or Firm*—Pillsbury Winthrop Shaw Pittman LLP

(57) ABSTRACT

Grayscales are formed by simultaneously projecting two or more patterned projection beams onto the substrate, each of which has a different pattern and a different intensity.

19 Claims, 3 Drawing Sheets

LITHOGRAPHIC APPARATUS AND DEVICE MANUFACTURING METHOD

RELATED APPLICATION

This application claims the benefit of priority to European Patent Application No. 01204598.5, filed Nov. 30, 2001, the contents of which are herein incorporated by reference.

BACKGROUND OF THE INVENTION

1. Field of the Invention

The present invention relates to a lithographic projection apparatus and device manufacturing methods.

2. Description of the Related Art

The term "programmable patterning device" as here employed should be broadly interpreted as referring to device that can be used to endow an incoming radiation beam with a patterned cross-section, corresponding to a pattern that is to be created in a target portion of the substrate. The terms "light valve" and "spatial light modulator" (SLM) can also be used in this context. Generally, the pattern will correspond to a particular functional layer in a device being created in the target portion, such as an integrated circuit or other device (see below). An example of such a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791.

An imaging apparatus as described above is currently employed to make mask writing machines, e.g. by the firm Micronic in Sweden. Such a mask can be used in a lithographic projection apparatus, which repetitively images the mask pattern onto a photosensitive substrate, such as a photoresist-coated silicon wafer, as part of the broader manufacturing process involved in producing integrated devices, such as IC's. The substrate in such a mask writing machine is, for example, a metallized plate (e.g. a Cr-coated quartz or $CaF_2$ plate) that has been coated with a layer of photoresist.

The idea behind such a mask writing machine is that an electronic file of a highly complex mask pattern is used to matrix-address the patterning device, which then diverts a patterned radiation beam onto a small portion of the mask plate. By changing the pattern in the patterned beam in accordance with the electronic file, and concurrently moving the beam over the whole surface of the mask plate, in either a scanning or a stepping motion, the final mask pattern is built up as a sum of combined, juxtaposed sub-patterns from the patterned beam. For this reason, such a machine is sometimes referred to as a "direct-write" machine.

Although machines as described in the previous paragraph have heretofore been used only in the manufacture of masks, it is, at least in principle, possible to use them in the manufacture of semiconductors and other integrated devices. In such a case, the mask plate would be replaced by, for example, a silicon wafer, and the pattern built up on the wafer by the patterning device would correspond to an array of die patterns. However, a major drawback of such an application would be its very low throughput. Whereas current direct-write machines might be expected to achieve a throughput of the order of one substrate per day, a state-of-the-art lithographic projection apparatus has a throughput of the order of one hundred substrates per hour. Nevertheless, it might still be interesting to pursue such an application. For example, in the case of a foundry making a small batch of a particular integrated device (such as a dedicated ASIC), it might be more attractive to endure a slow direct-write process as delivered by a machine as described above rather than to entail the very high costs, often of the order of $50,000–$100,000, of making a special mask for the batch in question. At the moment, such a choice might only be attractive in the case of a very small batch of a very expensive device. However, it would become much more attractive if the throughput of direct-write machines could be increased. More information with regard to conventional lithographic apparatus as here described can be gleaned, for example, from U.S. Pat. No. 6,046,792.

In direct-write machines such as the hereabove referred to, it is desirable not only to produce patterns having black and white shades (binary patterns), but also to allow the creation of intermediate gray shades (grayscaling). In prior art machines, such grayscaling can be achieved in different manners. For example, in a programmable mirror array (PMA) employing tiltable mirrors, each mirror (pixel) can be embodied to allow intermediate tilts (either continuously or discretely) between the zero-tilt and full-tilt extremes. Similarly, in a PMA employing mirrors that translate up and down in a piston-like fashion, causing phase shifts in coherent light reflected from those mirrors, each mirror can be embodied to allow intermediate translations short of the full amplitude, thus allowing phase-shifts at values between 0 and $\pi$. However, a disadvantage of these prior-art methods is that they require relatively complicated actuators to move each mirror. As a result, they tend to be relatively slow in their operation, which entails a throughput penalty. Moreover, the manufacture of such actuators is relatively difficult, and can often only be done with a relatively low yield, thus increasing manufacturing costs.

SUMMARY OF THE INVENTION

It is an aspect of the present invention to alleviate the problems described above.

It is an aspect of the present invention to provide an apparatus capable of performing grayscaling with a relatively high throughput and which can be manufactured with a relatively high yield.

This and other aspects are achieved according to the invention in a lithographic apparatus including a radiation system constructed and arranged to provide a first projection beam of radiation; a first programmable patterning device constructed and arranged to pattern the first projection beam according to a first desired pattern; a substrate table to hold a substrate; a projection system constructed and arranged to project the first patterned projection beam onto a target portion of the substrate; and a second programmable patterning device constructed and arranged to pattern a second projection beam provided by the radiation system according to a second desired pattern, wherein the projection system projects the second patterned projection beam onto the target portion of the substrate and the intensities of the first and second patterned projection beams are different.

This is advantageous since the apparatus can project a grayscale pattern onto the substrate instantaneously. By using different intensities for each patterned projection beam, the number of grayscales attainable for a given number of patterned projection devices is larger. Use of a greater number of programmable patterning devices producing patterned projection beams, preferably each with yet further differing intensities, provides a greater number of grayscales.

A beam splitter may be used to split the projection beam from the radiation source into the required number of projection beams for illuminating the programmable patterning devices. The beam splitters may be arranged such that they illuminate the patterning devices with projection beams of different intensities. Such an arrangement produces patterned projection beams with different intensities without necessarily reducing the overall intensity of the beam projected onto the substrate.

Alternatively, variable attenuators may be provided to reduce the intensity of the patterned projection beams projected onto the substrate. These may, for example, be placed to reduce the intensity of the projection beams that are incident on the patterning devices and/or may be located in the beam path of the patterned projection beams to directly reduce the intensity of the patterned projection beams. The complexity of the radiation system may therefore be reduced.

A further arrangement to vary the intensity of the patterned projection beams may be provided by the use of two or more separate radiation sources, producing projection beams with different intensities.

It may be desirable to combine each of the patterned projection beams into a single patterned projection beam that is projected onto the target portion of the substrate. Advantageously, this requires only a single projection system, thus keeping the apparatus costs to a minimum. Alternatively, each patterned projection system may be independently projected onto the target portion of the substrate, obviating the requirement to combine the patterned projection beams.

In addition to producing grayscales by simultaneously projecting a plurality of patterns onto the target portion of the substrate, one or more of the programmable patterning devices may be used to pattern the projection beam for additional exposures that are projected onto the same target portion of the substrate. By such an arrangement further grayscales can be provided without the number of programmable patterning devices becoming excessively large.

According to a further aspect of the invention there is provided a device manufacturing method including providing a substrate that is at least partially covered by a layer of radiation sensitive material; providing a first projection beam of radiation using a radiation system; using a first programmable patterning device to endow the first projection beam with a first pattern in its cross-section; projecting the first patterned projection beam of radiation onto a target portion of the layer of radiation-sensitive material; providing a second projection beam of radiation; providing a second programmable patterning device to endow the second projection beam with a second pattern in its cross-section; and projecting the second patterned projection beam of radiation onto the target portion of the layer of radiation sensitive material, wherein the first and second patterned projection beams have different intensities.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
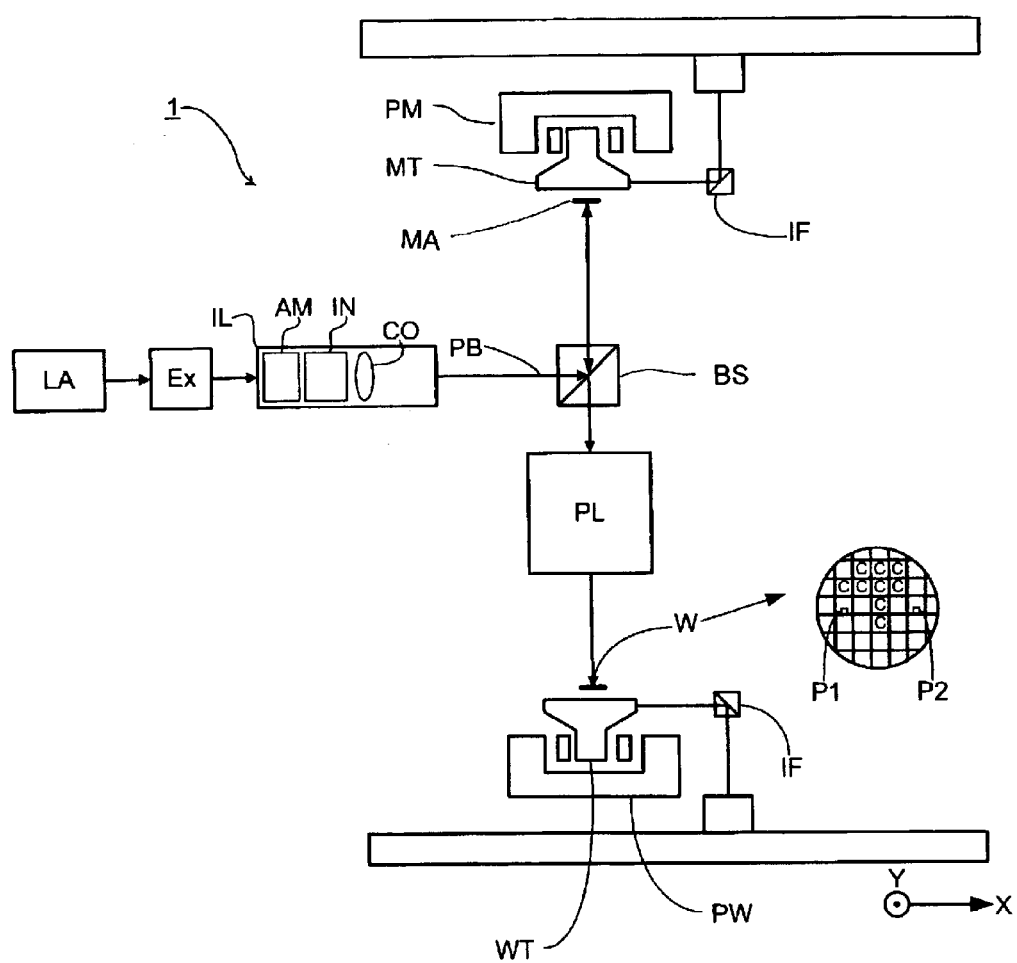
FIG. 1 depicts a lithographic projection apparatus according to an embodiment of the invention.

FIG. 1 schematically depicts a lithographic projection apparatus 1 according to an exemplary embodiment of the invention. The apparatus 1 includes a radiation system Ex, IL, constructed and arranged to supply a projection beam PB of radiation (e.g. UV radiation); a radiation source LA; a first object (mask) table MT provided with a mask holder to hold a programmable patterning device MA (e.g. an SLM), and connected to a first positioning device PM that accurately positions the programmable patterning device MA with respect to a projection system or lens PL; a second object (substrate) table WT provided with a substrate holder to hold a substrate W (e.g. a resist-coated silicon wafer), and connected to a second positioning device PW that accurately positions the substrate with respect to lens PL, the lens PL (e.g. a refractive mirror group) constructed and arranged to image an irradiated portion of the programmable patterning device MA onto a target portion C (e.g. comprising one or more dies) of the substrate W.

As here depicted, the apparatus 1 is of a reflective type (e.g. has a reflective programmable patterning device). However, in general, it may also be of a transmissive type, for example (e.g. with a transmissive programmable patterning device). Alternatively, the apparatus 1 may employ another kind of patterning device, such as a programmable LCD array of a type as referred to above.

The source LA (e.g. an excimer laser) produces a beam PB of radiation. This beam is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the programmable patterning device MA has a desired uniformity and intensity distribution in its cross-section.

It should be noted with regard to FIG. 1 that the source LA may be within the housing of the lithographic projection apparatus 1 (as is often the case when the source LA is a mercury lamp, for example), but that it may also be remote from the lithographic projection apparatus 1, the radiation beam PB which it produces being led into the apparatus 1 (e.g. with the aid of suitable directing mirrors). This latter scenario is often the case when the source LA is an excimer laser. The current invention encompasses both of these scenarios.

The beam PB subsequently intercepts the programmable patterning device MA, which is held on the mask table MT. Having been reflected by the programmable patterning device MA, the beam PB passes through the lens PL, which focuses the beam PB onto a target portion C of the substrate W. With the aid of the second positioning device PW, interferometers IF, and alignment marks P1, P2 the substrate table WT can be moved accurately, e.g. so as to position different target portions C in the path of the beam PB. Similarly, the first positioning device PM can be used to accurately position the programmable patterning device MA with respect to the path of the beam PB, e.g. during a scan.

The first positioning device PM may be omitted, in which case the position of the programmable patterning device MA relative to the beam PB will be fixed. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus 1 can be used in three different modes:

1. In step mode, the mask table MT is kept essentially stationary, and an entire mask image is projected in one go (i.e. a single "flash") onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g. the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution;
3. In pulse mode, the mask table MT is kept essentially stationary and an entire image of the programmable patterning device MA is projected onto a target portion C of the substrate W. The substrate table WT is moved with an essentially constant speed such that the projection beam PB is caused to scan a line across the substrate W. The pulses of the radiation system are timed such that successive target portions C that are exposed on the substrate W are adjacent to one another. Consequently, once the projection beam PB has scanned an entire line of the substrate W the complete pattern for that line is exposed on the substrate W. The process is repeated until the complete substrate W has been exposed line by line.

Figure 2:
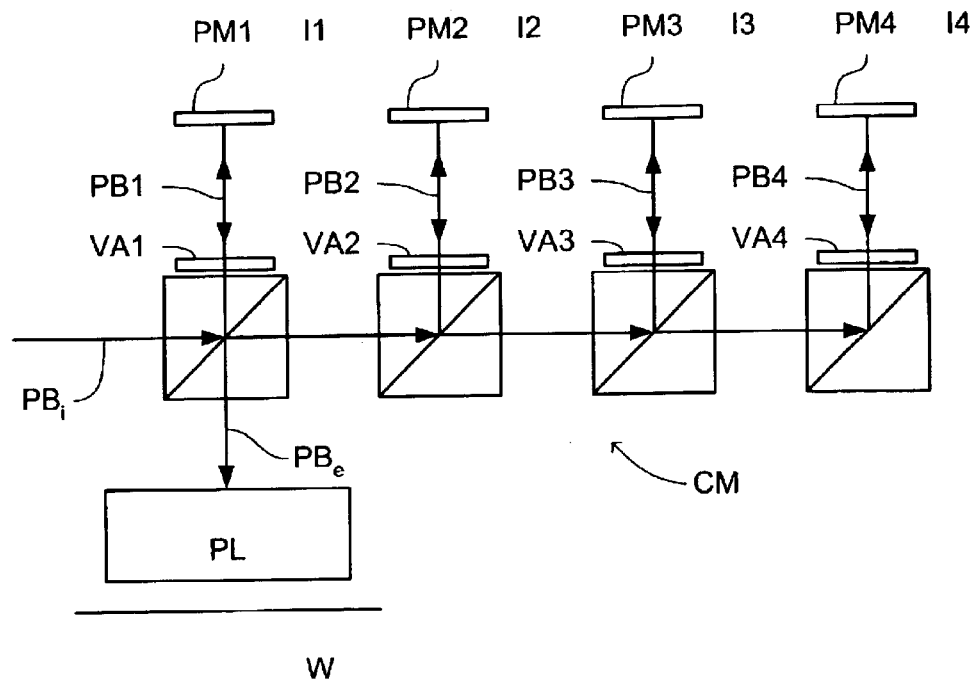
FIG. 2 depicts part of an imaging apparatus according to a particular embodiment of the invention.

FIG. 2 depicts part of an imaging apparatus according to another exemplary embodiment of the present invention. In this embodiment, the programmable patterning device MA of FIG. 1 comprise a plurality N=4 of component patterning devices PM1, PM2, PM3, PM4. In addition, the beam PB is directed towards the patterning device MA by 4 mirror blocks, which serve to divide the incident projection beam $PB_i$ into component projection beams PB1, PB2, PB3, PB4. These component projection beams PB1, PB2, PB3, PB4 are then reflected from, and patterned by, their respective component patterning devices PM1, PM2, PM3, PM4. As here depicted, each component projection beam PB1, PB2, PB3, PB4 passes through its own variable attenuator VA1, VA2, VA3, VA4, resulting in individual intensities I1, I2, I3, I4 in the four component projection beams. The relative values of I1–I4 can then be chosen according to a desired operation of the apparatus.

Alternatively, one may omit (at least some of) the variable attenuators VA1–VA4 and simply accept the intrinsic values of I1–I4 resulting from the nature of the beam splitter BS.

After being patterned, the component projection beams PB1, PB3, PB3, PB4 are reflected back to their respective mirror blocks, which serve to combine the component projection beams into a single, composite, emergent projection beam $PB_e$. The mirror blocks therefore serve the function of a combining device CM. Alternatively, the component projection beams PB1, PB2, PB3, PB4 may be independently projected onto the target portion C of the substrate W.

It will be appreciated that the required variation in intensities I1, I2, I3 . . . In can be achieved in different ways. The radiation system may comprise a different radiation source (such as a laser or lamp) for each component patterning device. The intensities can then be varied by varying the output power of each radiation source, or by employing a variable attenuator between each radiation source and its corresponding component patterning device, for example.

Depending on the relative values of I1–I4, various degrees of grayscaling can be achieved in the emergent projection beam $PB_e$, which passes on to the projection system PL and, ultimately, the substrate W. The principle of this grayscaling will next be described.

Figure 3:
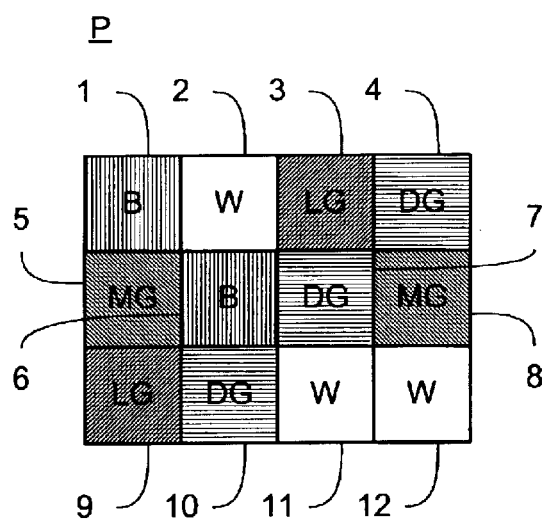
FIG. 3 illustrates the grayscaling principle employed by the invention.

FIG. 3 schematically depicts the grayscaling principles employed in the present invention, on the basis of a simplified pattern P. As shown in the left part of FIG. 3, the pattern P comprises 12 pixel positions, each of which is labeled with an ordinal 1–12. The various pixel positions have different "tints", as follows: pixel positions 1 and 6 are "black" (B); pixel positions 4, 7 and 10 are "dark gray" (DG); pixel positions 5 and 8 are "medium gray" (MG); pixel positions 3 and 9 are "light gray" (LG); and positions 2, 11 and 12 are "white" (W).

The lower part of FIG. 3 shows how the present invention can be employed to achieve the grayscaling effects (i.e. the intermediate tints DG, MG and LG) in the pattern P. To this end, FIG. 3 shows the four component patterning devices PM1–PM4 of FIG. 2, together with the proposed pixel configurations which, when combined, will achieve the pattern P. Since each of the component patterning devices is of a binary type, its individual pixels can be either "on" (1) or "off" (0), respectively meaning that they either pass light to the substrate W or block it. In this respect, grayscaling is achieved as described below.

Pixel positions 1 and 6 are "off" in all four component patterning devices. These positions will therefore be "black" in the resulting pattern P, as desired. Pixel positions 2, 11 and 12 are "on" in all four component patterning devices. These positions will therefore receive maximum intensity I ("white") in the resulting pattern P, as desired. Pixel positions 3 and 9 are "on" in component patterning devices PM1–PM3, but "off" in component patterning device PM4. These positions in the pattern P therefore receive intensities I1+I2+I3, but not I4. They will therefore be relatively bright, but will not be "white". In this manner, a "light gray" tint is achieved, as desired.

Pixel positions 5 and 8 are "on" in patterning devices PM1 and PM3, but "off" in patterning devices PM2 and PM4. These positions in the pattern P therefore receive intensity I1+I3, but not I2+I4. They will therefore be less bright than the case in the previous paragraph. In this manner, a "medium gray" tint is achieved, as desired.

Pixel positions 4, 7 and 10 are "on" in patterning devices PM3 and PM4, but "off" in patterning devices PM1 and PM2. These positions in the pattern P therefore receive intensity I3+I4, but not I1+I2. They will therefore be less bright than the case in the previous paragraph (since I1>I2>I3>I4 in this embodiment). In this manner, a "dark gray" tint is achieved, as desired.

One of ordinary skill in the art will appreciate that many different (alternative) permutations of the pixel configurations in component patterning devices PM1–PM4 can be employed in a similar manner to achieve many different gray "tints".

By properly choosing different values for In (n=4 in the above example), it is possible to achieve grayscaling over a wide range of values. One can, for example, choose the intensities In such that I1:I2:I3:I4 . . . In=1:2:4:8 . . . $2^{n-1}$. This provides the greatest number of grayscales attainable for a given number of component patterning devices. Alternatively, allowing grayscaling "tints" even if one of the component patterning devicess falls out of operation, one might choose the intensities In such that I1:I2:I3:I4:I5 . . . In=1:1:2:3:5 . . . In–2+In–1. Apart from these examples there are, of course, many other possibilities.

Figure 4:
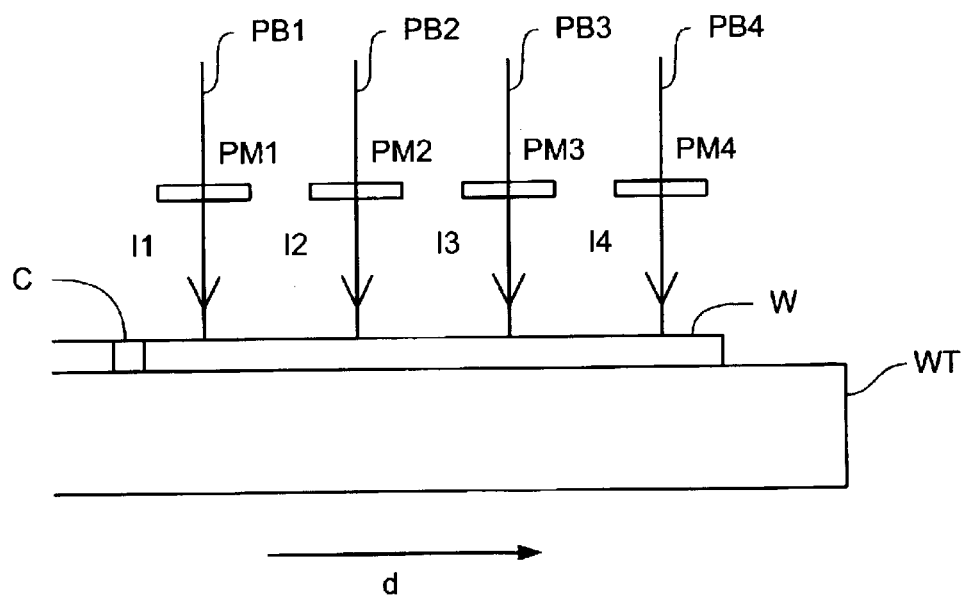
FIG. 4 depicts part of an imaging apparatus according to another embodiment of the invention.

FIG. 4 shows a detail of an arrangement to produce additional gray "tints" according to the present invention. For simplicity, FIG. 4 does not show the details of how the component projection beams PB1–PB4 are generated or directed towards their respective component patterning devices PM1–PM4, nor does it show the optics employed to focus the component projection beams onto the substrate W. Furthermore, it depicts the component patterning devices PM1–PM4 as being of a transmissive type. However, it should be noted that the same principles apply to component patterning devices of a reflective type.

As here depicted, the wafer table WT of FIG. 1 can be moved back and forth in the direction d. In this manner, a given target portion C on the substrate W can be scanned through each of the patterned component projection beams PB1–PB4 emergent from the component patterning devices PM1–PM4. If the velocity v of the substrate W in the direction d is correctly matched to the timing/synchronization of pattern generation in the component patterning devices PM1–PM4, then the target portion C will, for example, be exposed to each of the patterns shown in the lower part of FIG. 3 during its passage through the patterned component projection beams PB1–PB4. This is a serial exposure instead of the parallel exposure depicted in FIG. 2.

As an alternative to moving the substrate W through the beams PB1–PB4, one may also move the beams PB1–PB4 and keep the substrate W stationary.

The techniques of using multiple components patterning devices simultaneously exposed may be combined with the technique of using multiple exposures of the same patterning devices to produce additional gray "tints". In this case, the pattern on a target portion of the substrate is the result of two or more successive exposures of two or more component patterning devices that are simultaneously projected onto the target portion of the substrate. The intensities and the pattern can be different for each component patterning device and for each exposure.

It is also possible to use only a single programmable patterning device to repeatedly expose the target portion C, changing the illumination level and the pattern between each exposure.

While specific embodiments of the present invention have been described above, it will be appreciated that the invention may be practiced otherwise than as described. The description is not intended to limit the invention.

What is claimed is:

1. A lithographic projection apparatus, comprising:
   a radiation system constructed and arranged to provide a first projection beam of radiation;
   a first programmable patterning device constructed and arranged to pattern the first projection beam according to a first desired pattern;
   a substrate table to hold a substrate;
   a projection system constructed and arranged to project the first patterned projection beam onto a target portion of the substrate; and
   a second programmable patterning device constructed and arranged to pattern a second projection beam provided by the radiation system according to a second desired pattern, wherein the projection system projects the second patterned projection beam onto the target portion of the substrate and the intensities of the first and second patterned projection beams are different, and
   wherein the first and second programmable patterning devices are configured to be in a cooperative relationship such that grayscaling effects are generated within the target portion.

2. A lithographic projection apparatus according to claim 1, wherein the patterns for each programmable patterning device are different such that a sub-area within the target portion is exposed by any one of: the first projection beam; the second projection beam; neither projection beam; and both projection beams.

3. A lithographic projection apparatus according to claim 1, wherein the radiation system comprises a beam splitter configured to provide the first and second projection beams, such that the first and second projection beams have different intensities.

4. A lithographic projection apparatus according to claim 1, wherein a variable attenuator is provided to adjust the intensity of at least one of the first and second projection beams and the first and second patterned projection beams.

5. A lithographic projection apparatus according to claim 1, wherein the radiation system comprises first and second radiation sources, the intensities of which can be independently set, that provide the first and second projection beams, respectively.

6. A lithographic projection apparatus according to claim 1, wherein the first and second patterned projection beams are combined into a single patterned projection beam that is projected onto the target portion of the substrate by the projection system.

7. A lithographic projection apparatus according to claim 1, wherein the first and second patterned projection beams are independently projected onto the target portion of the substrate.

8. A lithographic projection apparatus according to claim 1, wherein the apparatus is adapted to project at least a second exposure patterned by at least one of the first and second programmable patterning devices onto the target portion of the substrate.

9. A device manufacturing method, comprising:
   providing a substrate that is at least partially covered by a layer of radiation sensitive material;
   providing a first projection beam of radiation using a radiation system;
   using a first programmable patterning device to endow the first projection beam with a first pattern in its cross-section;
   projecting the first patterned projection beam of radiation onto a target portion of the layer of radiation-sensitive material;
   providing a second projection beam of radiation;
   providing a second programmable patterning device to endow the second projection beam with a second pattern in its cross-section; and
   projecting the second patterned projection beam of radiation onto the target portion of the layer of radiation sensitive material, wherein the first and second patterned projection beams have different intensities,
   wherein the first and second programmable patterning devices are configured to be in a cooperative relationship such that grayscaling effects are generated within the target portion.

10. A lithographic projection apparatus comprising:

a plurality of programmable patterning devices, each of the plurality of programmable patterning devices being constructed and arranged to pattern a component beam of radiation according to a desired pattern such that a plurality of patterned component beams are created;

a substrate table to hold a substrate; and a projection system constructed and arranged to project each of the plurality of patterned component beams onto a substantially same exposure area of a target portion of the substrate, wherein at least two of the plurality of patterned component beams have a different intensity, and wherein at least two of said plurality of programmable patterning devices, generating said at least two component beams, are configured to be in cooperative relationship such that grayscaling effects are generated within the exposure area.

11. A lithographic projection apparatus according to claim 10, wherein the plurality of patterned component beams are superposed on the exposure area such that a plurality of exposure sub-areas is created within the exposed area.

12. A lithographic projection apparatus according to claim 10, wherein each of the plurality of desired patterns has a different intensity.

13. A lithographic projection apparatus according to claim 10, wherein a plurality of desired patterns corresponds to three or more desired patterns.

14. A lithographic projection apparatus according to claim 10, wherein each of the plurality of programmable patterning devices is one of a transmissive type and a reflective type.

15. A lithographic projection apparatus according to claim 10, wherein the plurality of patterned component beams are combined into a single patterned beam that is projected onto the exposure area of the target portion.

16. A lithographic projection apparatus according to claim 10, wherein each of the plurality of patterned component beams is independently projected onto the exposure area of the target portion.

17. A lithographic projection apparatus according to claim 10, wherein the component beams are formed by splitting a beam of radiation.

18. A lithographic projection apparatus according to claim 10, wherein the component beams are provided by a plurality of sources corresponding to the number of patterning devices.

19. A lithographic projection apparatus according to claim 10, wherein each of the plurality of patterned component beams is patterned with a substantially same number of pixel elements.

* * * * *